(12) United States Patent
Lim et al.

(10) Patent No.: US 10,887,983 B2
(45) Date of Patent: Jan. 5, 2021

(54) PRINTED CIRCUIT BOARD

(71) Applicant: SAMSUNG ELECTRO-MECHANICS CO., LTD., Suwon-si (KR)

(72) Inventors: Sung-Jun Lim, Suwon-si (KR); Seong-Hwan Park, Suwon-si (KR); Kyung-Ho Lee, Suwon-si (KR); Kyung-Moon Jung, Suwon-si (KR); Chul-Kyu Kim, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 16/390,310

(22) Filed: Apr. 22, 2019

(65) Prior Publication Data
US 2020/0022258 A1    Jan. 16, 2020

(30) Foreign Application Priority Data

Jul. 13, 2018 (KR) .................. 10-2018-0081560

(51) Int. Cl.
*H05K 1/02* (2006.01)
*H05K 1/14* (2006.01)
*H05K 1/11* (2006.01)

(52) U.S. Cl.
CPC ......... *H05K 1/0298* (2013.01); *H05K 1/0215* (2013.01); *H05K 1/0218* (2013.01); *H05K 1/0271* (2013.01); *H05K 1/0278* (2013.01); *H05K 1/147* (2013.01); *H05K 1/0224* (2013.01); *H05K 1/11* (2013.01); *H05K 1/115* (2013.01)

(58) Field of Classification Search
CPC .. H05K 1/0298; H05K 1/0278; H05K 1/0215; H05K 1/0271; H05K 1/147; H05K 1/0218; H05K 1/11; H05K 1/0224; H05K 1/115; H05K 3/0052; H05K 2201/10204; H05K 3/4691; H05K 2201/068; H05K 2201/093
See application file for complete search history.

(56) References Cited

U.S. PATENT DOCUMENTS 6,835,897 B2 * 12/2004 Chang .................. H01L 23/145
                                                       174/254
7,253,363 B2 *  8/2007 Iwasaki ............. H01L 23/49838
                                                       174/254
(Continued)

FOREIGN PATENT DOCUMENTS

JP      2012-084800 A    4/2012
KR   10-2009-0089175 A    8/2009

OTHER PUBLICATIONS

Korean Office Action dated Oct. 11, 2019 in corresponding Korean Patent Application No. 10-2018-0081560 (5 pages in English, 5 pages in Korean).

*Primary Examiner* — Ishwarbhai B Patel
(74) *Attorney, Agent, or Firm* — NSIP Law

(57) ABSTRACT

A printed circuit board includes a circuit layer and a ground layer disposed above the circuit layer. The ground layer includes ground layer sections each having metal members, arranged in parallel in one direction on a plane. Areas of the metal members of adjacent ground layer sections are different from each other. The areas of the metal members are determined based on respective areas of circuits of the circuit layer corresponding to respective ground layer sections.

20 Claims, 5 Drawing Sheets

(56) References Cited

U.S. PATENT DOCUMENTS

| | | | |
|---|---|---|---|
| 8,631,567 B2* | 1/2014 | Lee | H05K 3/429 |
| | | | 156/184 |
| 2004/0084205 A1* | 5/2004 | Chang | H01L 23/49822 |
| | | | 174/250 |
| 2009/0173533 A1* | 7/2009 | Brock | H01R 12/592 |
| | | | 174/350 |
| 2012/0092838 A1 | 4/2012 | Kitano et al. | |
| 2012/0186860 A1* | 7/2012 | Takaoka | H05K 1/028 |
| | | | 174/254 |

* cited by examiner

I-I'

PRINTED CIRCUIT BOARD

CROSS-REFERENCE TO RELATED APPLICATIONS

This application claims the benefit under 35 USC 119(a) of Korean Patent Application No. 10-2018-0081560 filed on Jul. 13, 2018 in the Korean Intellectual Property Office, the entire disclosure of which is incorporated herein by reference for all purposes.

BACKGROUND

1. Field

The present disclosure relates to a printed circuit board.

2. Description of Related Art

As electronic devices become increasingly smaller and thinner, the printed circuit board installed in an electronic device is also required to be slimmer and have a higher density. A rigid-flexible printed circuit board may be used for signal transfer with a display and the main board, and the thickness and width of a rigid printed circuit board may be minimized for better utilization of space. When the printed circuit board has a small thickness and width, however, it may become difficult to control warpage of the printed circuit board.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes a circuit layer and a ground layer disposed above the circuit layer. The ground layer includes ground layer sections each having metal members, arranged in parallel in one direction on a plane. Areas of the metal members of adjacent ground layer sections are different from each other. The areas of the metal members are determined based on respective areas of circuits of the circuit layer corresponding to respective ground layer sections.

The areas of the metal members may increase from one ground layer section of the ground layer sections to an opposite ground layer section of the ground layer sections.

A length of the printed circuit board in the one direction may be less than a length of the printed circuit board in another direction perpendicular to the one direction.

The metal members may be linear structures.

The areas of the metal members in each of the ground layer sections may be adjusted based on gaps between the linear structures.

The linear structures may be configured as a mesh structure.

In another general aspect, a printed circuit board includes a rigid portion and a flexible portion. The rigid portion includes a ground layer including metal members and ground layer sections arranged in parallel in one direction. The flexible portion and the rigid portion are arranged in the one direction. Adjacent ground layer sections have respective areas of metal members that are different from each other.

The areas of the metal members may increase from one ground layer section to an opposite ground layer section.

The metal members may be linear structures.

The areas of the metal members in each of the ground layer sections may be adjusted based on gaps between the linear structures.

The linear structures may be configured as a mesh structure.

A length of the rigid portion in the one direction may be less than a length of the flexible portion in the one direction.

In another general aspect, a printed circuit board includes a first rigid portion and a second rigid portion separated from each other in one direction and arranged in parallel in the one direction, a first flexible portion, and a second flexible portion. The first flexible portion is coupled to the first rigid portion and interposed between the first rigid portion and the second rigid portion. The second flexible portion is coupled to the second rigid portion and interposed between the first rigid portion and the second rigid portion. The first rigid portion includes a first ground layer having metal members and ground layer sections arranged in parallel in the one direction. Adjacent ground layer sections of the first ground layer have respective areas of metal members that are different from each other.

The areas of the metal members in the first ground layer may increase from one ground layer section to an opposite ground layer section of the ground layer sections.

The second rigid portion may include a second ground layer comprising metal members. The areas of the metal members in the first ground layer may be symmetrical with areas of metal members in the second ground layer.

Template may include a dummy portion connecting the first rigid portion with the second rigid portion.

A length of the rigid portion in the one direction may be less than a length of the flexible portion in the one direction.

The metal members may be linear structures.

The areas of the metal members in the first ground layer may be adjusted based on gaps between the linear structures.

The linear structures may be configured as a mesh structure.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
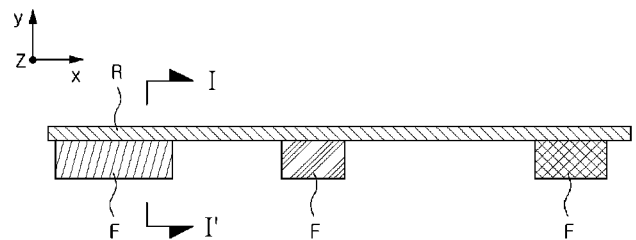
FIG. 1A depicts an example of a printed circuit board.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1B:
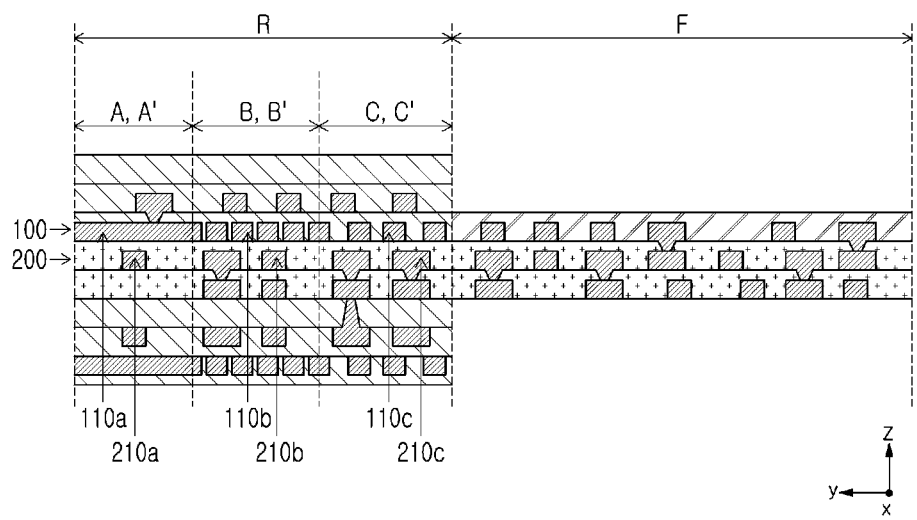
FIG. 1B illustrates a cross section taken along line I-I' of FIG. 1A.
Figure 2:
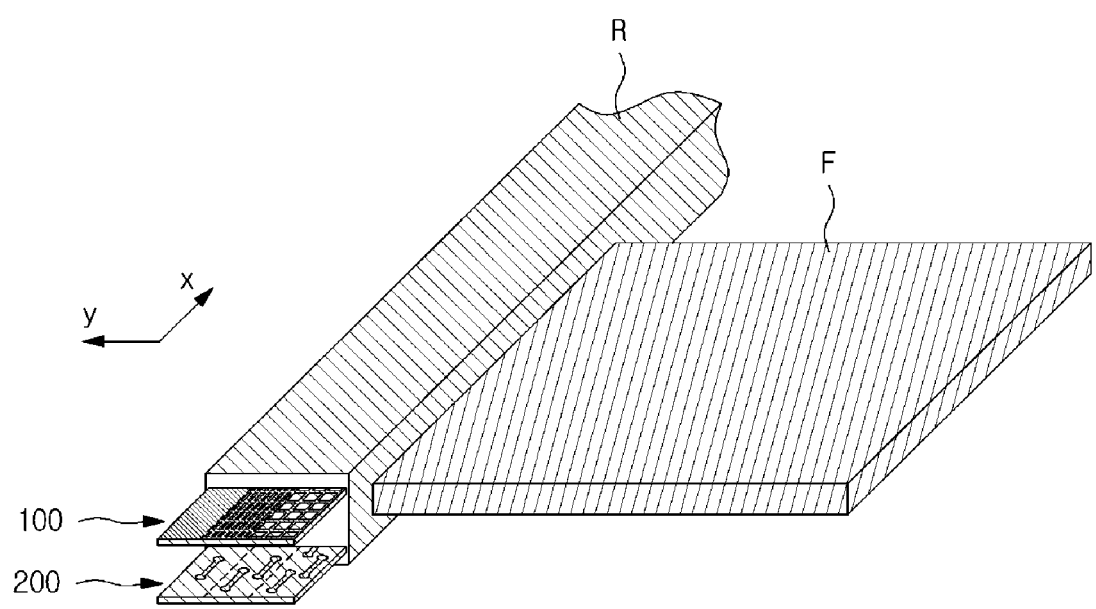
FIG. 2 depicts an example of a partial view of a ground layer and circuit layer of the printed circuit board.
Figure 3:
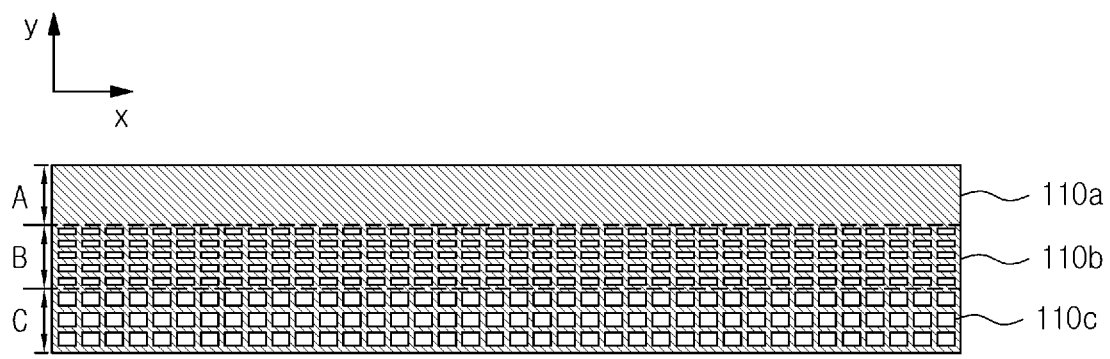
FIG. 3 depicts an example of the ground layer of the printed circuit board.
Figure 4:
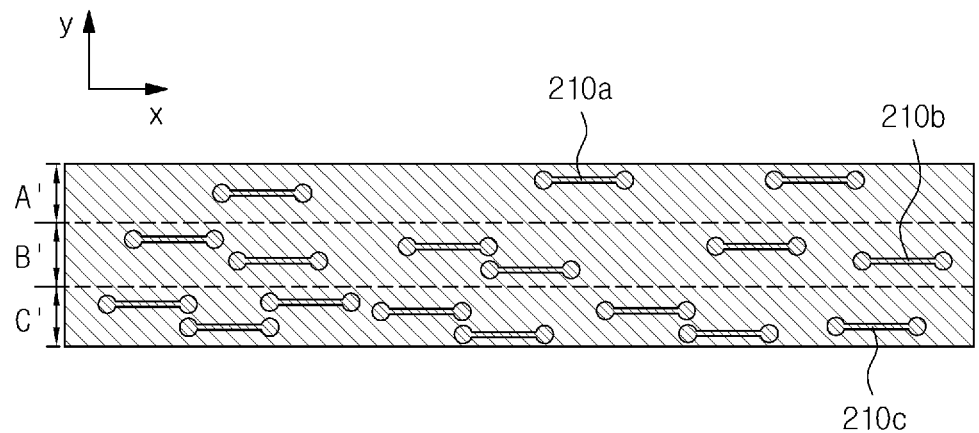
FIG. 4 depicts an example of the circuit board of the printed circuit board.

FIG. 1A depicts an example of a printed circuit board, FIG. 1B illustrates a cross section taken along line I-I' of FIG. 1A, and FIG. 2 depicts an example of a partial view of a ground layer 100 and a circuit layer 200 of a left and view of the printed circuit board of FIG. 1A. FIG. 3 depicts an example of the ground layer 100 of the printed circuit board, and FIG. 4 depicts an example of the circuit board 200 of the printed circuit board.

Hereinafter, the following description is provided, assuming that the printed circuit board is oriented as shown in an x-y plane.

Referring to FIGS. 1A to 4, the printed circuit board includes a plurality of insulating layers laminated above and below one another (i.e., laminated in the direction of the z-axis), and the ground layer 100 and the circuit layer 200 formed on surfaces of the insulating layer to be arranged between the plurality of insulating layers.

The insulating layers may be made of an insulating material, including a thermosetting resin or thermoplastic resin, such as, for example, epoxy resin, polyimide resin, BT resin, and LCP, and may have stiffeners, such as glass cloth or inorganic filler (e.g., silica), contained therein. Specifically, the insulating layer may be a build-up film such as PPG (prepreg) or ABF (Ajinomoto Build-up Film).

The circuit layer 200 is a layer containing a circuit for transferring a signal, and the circuit may be made of metals 110a, 110b, 110c, such as any one or any combination of any two or more of copper (Cu), palladium (Pd), aluminum (Al), nickel (Ni), titanium (Ti), gold (Au) and platinum (Pt).

The ground layer 100 includes a metal that may function as ground, and this metal may be the same as the metal forming the circuit.

The circuit layer 200 and the ground layer 100 are arranged above and below each other. The circuit of the circuit layer 200 and the metal of the ground layer 100 may be electrically connected with each other through a via.

The number of ground layers 100 may be less than the number of the circuit layers 200. For example, there may be 11 insulating layers, 8 circuit layers 200 and 4 ground layers 100. Although one ground layer 100 and one circuit layer 200 are illustrated in the example drawing, the present disclosure is not limited to what is illustrated.

The length of the printed circuit board in one direction (e.g., in the y-axis direction) may be less than the length of the printed circuit board in another direction perpendicular to the one direction (e.g., in the x-axis direction). In such a case, greater control of warpage may be required in the y-axis direction. The warpage in the y-axis direction, for example, may be controlled with the area of metal in the ground layer 100, and once the warpage is controlled, the printed circuit board may become parallel to the x-axis. Referring to FIG. 3, the ground layer 100 is divided into a plurality of sections A, B, C arranged in parallel in one planar direction. Here, the one planar direction may be one direction of the x-y plane, for example, the direction in the y-axis. Moreover, the plurality of sections may mean two or more sections, and FIG. 3 illustrates an example with three sections. In other words, in FIG. 3, three sections A, B, C are arranged in parallel in the y-axis direction.

The plurality of sections may be virtually divided, and thus boundaries between the plurality of sections may not be shown.

The lengths of the plurality of sections may be substantially the same with one another in the y-axis direction. That is, in FIG. 3, the vertical widths of the three sections A, B, C may be substantially the same with one another. In such a case, since the lengths in the x-axis direction are substantially the same with one another and the lengths in the y-axis direction are substantially the same with one another in the three sections A, B, C, the areas of the plurality of sections are substantially the same with one another.

The areas of metal in two adjacent sections of the plurality of sections may be different from each other. In FIG. 3, in the plurality of sections A, B, C, the ratio of the area of metals $110a$, $110b$, $110c$ for the same area in the two adjacent sections may be 100:80:60. In such a case, the areas of metal $110a$, $110b$ in section A and section B are different from each other, and the areas of metal $110b$, $110c$ in section B and section C are different from each other. Here, the areas of metal $110a$, $110c$ are also different from each other between section A and section C, but the present disclosure is not restricted in such a way that the area of metal is different in every section.

Meanwhile, the area of metal being 100 in one section means that the metal is formed entirely in the pertinent section. Moreover, the area of metal being 80 or 60 means that the metal is formed partially in the pertinent section, and the portion of the section where the metal is not formed may be void or filled with an insulating layer laminated above (or below) the pertinent section. Accordingly, the less the area of the metal, the greater the area of the insulating layer included in the ground layer 100.

Meanwhile, the areas of metals $110a$, $110b$, $110c$ of the ground layer 100 may be substantially the same with one another in the x-axis direction, although different from one another in the y-axis direction. Moreover, in the case of where the printed circuit board includes a plurality of ground layers 100, the areas of metals $110a$, $110b$, $110c$ of the ground layers 110 may be substantially the same with one another in the z-axis direction.

In the plurality of sections, the areas of the metals $110a$, $110b$, $110c$ of the ground layer 100 may each increase from one section to the opposite section. Here, the one section may be the section at one end in the one direction (i.e., in the y-axis direction), and the opposite section may be the section at the opposite end in the one direction. In FIG. 3, the one section may be section C, and the opposite section may be section A. The areas of metals $110a$, $110b$, $110c$ each increase from section C to section A.

The area of metals $110a$, $110b$, $110c$ for each of the plurality of sections in the ground layer 100 may be determined based on the area of circuit $210a$, $210b$, $210c$ of the circuit layer 200 corresponding to the pertinent section as shown in FIGS. 1B and 4, for example.

For example, in the case where the ground layer 100 is divided into the three sections A, B, C as shown in FIG. 3, the circuit layer 200 may be also divided into three sections A', B,' C' as shown in FIGS. 1B and 4, for example. Section A and section A' are positioned at the same location on the z-axis, section B and section B' are positioned at the same location on the z-axis, and section C and section C' are positioned at the same location on the z-axis. Moreover, if the areas of sections A, B and C are substantially the same with one another in the ground layer 100, the areas of section A', B' and C' may also be substantially the same with one another in the circuit layer 200.

In FIG. 1B, for example, the area occupied by the circuit $210a$ in section A' of the circuit layer 200 is relatively small when compared to the area occupied by the circuit $210c$ in section C', which is relatively large. However, the area occupied by the circuit $210b$ in section B' is between the area of the circuit $210a$ and the area of the circuit $210c$.

In this example, the area of the metal $110a$ in section A of the ground layer 100 is relatively large when compared to the area of the metal $110c$ in section C is relatively small, while the area of the metal $110b$ in section B is between the area of the metal $110a$ and the area of the metal $110c$.

The metals $110a$, $110b$, $110c$ of the ground layer 100 may be configured with a plurality of linear structures. The plurality of linear structures may be arranged in parallel with one another. Moreover, the metals $110a$, $110b$, $110c$ of the ground layer 100 may each have a plurality of linear structures that intersect with one another, for example, a mesh structure, a hatch structure, etc. In other words, the plurality of linear structures may intersect with one another orthogonally or obliquely.

In an example where the metals $110a$, $110b$, $110c$ of the ground layer 100 are each configured with a plurality of linear structures, each of the areas of the metals $110a$, $110b$, $110c$ of the ground layer 100 may be adjusted based on the gaps between the plurality of linear structures. For instance, in FIG. 3, the gap between the linear structures in section B is narrower than the gap between the linear structures in section C. As a result, the area of the metal $110b$ in section B is greater than the area of the metal $110c$ in section C.

In other words, the areas of the metals $110a$, $110b$, $110c$ may be adjusted with size and number of openings that expose the insulating layer. The size and/or number of the openings in section B is greater than the size and/or number of the openings in section C. Accordingly, the area of the metal $110b$ in section B is greater than the area of the metal $110c$ in section C. Meanwhile, the insulating layer in the vicinity of the ground layer 100 flows into the openings.

Referring to FIG. 1A FIG. 1B and FIG. 2 again, the printed circuit board consistent with an example of the present disclosure may include a rigid portion R and a flexible portion F. The rigid portion R, and the flexible portion F are disposed in one direction, which may be the y-axis direction in the drawings.

The rigid portion R is a portion including an insulating layer made of a rigid material and having little flexibility, and the flexible portion F is a portion including only an insulating layer made of a flexible material and having flexibility greater than the rigid portion.

The length of the rigid portion R in one direction is less than the length of the flexible portion F in the one direction. Moreover, the rigid portion R has the length in one direction (i.e., in the y-axis direction) that is less than the length in the other, perpendicular direction (i.e., in the x-axis direction). In this example, in the rigid portion R, a control of warpage in the y-axis direction may be required.

Meanwhile, the flexible portion F may be configured in plurality. As shown in the drawings, for the single rigid portion R extending in the x-axis direction, a plurality of the flexible portions F is arranged in the y-axis direction, and each of the flexible portions F in the plurality of the flexible portions F is aligned with another in the x-axis direction.

The rigid portion R may include the circuit layer 200 and the ground layer 100 arranged above and below each other, and the ground layer 100 includes the metals 110*a*, 110*b*, 110*c*. The ground layer 100 is divided into a plurality of sections that are arranged in parallel in one direction, and the areas of two adjacent sections of the plurality of sections of the ground layer 100 are different from each other. In the plurality of sections, each of the areas of the metals 110*a*, 110*b*, 110*c* of the ground layer 100 may be increased from one section on one side of the ground layer to another section on the opposite side of the ground layer. The areas of the metals 110*a*, 110*b*, 110*c* of the ground layer 100 may be determined based on the areas of the corresponding circuits 210*a*, 210*b*, 210*c* of the circuit layer 200. The metals 110*a*, 110*b*, 110*c* of the ground layer 100 may each be configured with a plurality of linear structures. In the case where the metals 110*a*, 110*b*, 110*c* of the ground layer 100 are configured with the plurality of linear structures, the areas of the metals 110*a*, 110*b*, 110*c* of the ground layer 100 may be adjusted based on the gaps between the plurality of linear structures. The areas of the metals 110*a*, 110*b*, 110*c* may be adjusted with the size and number of openings that expose the insulating layer.

Figure 5:
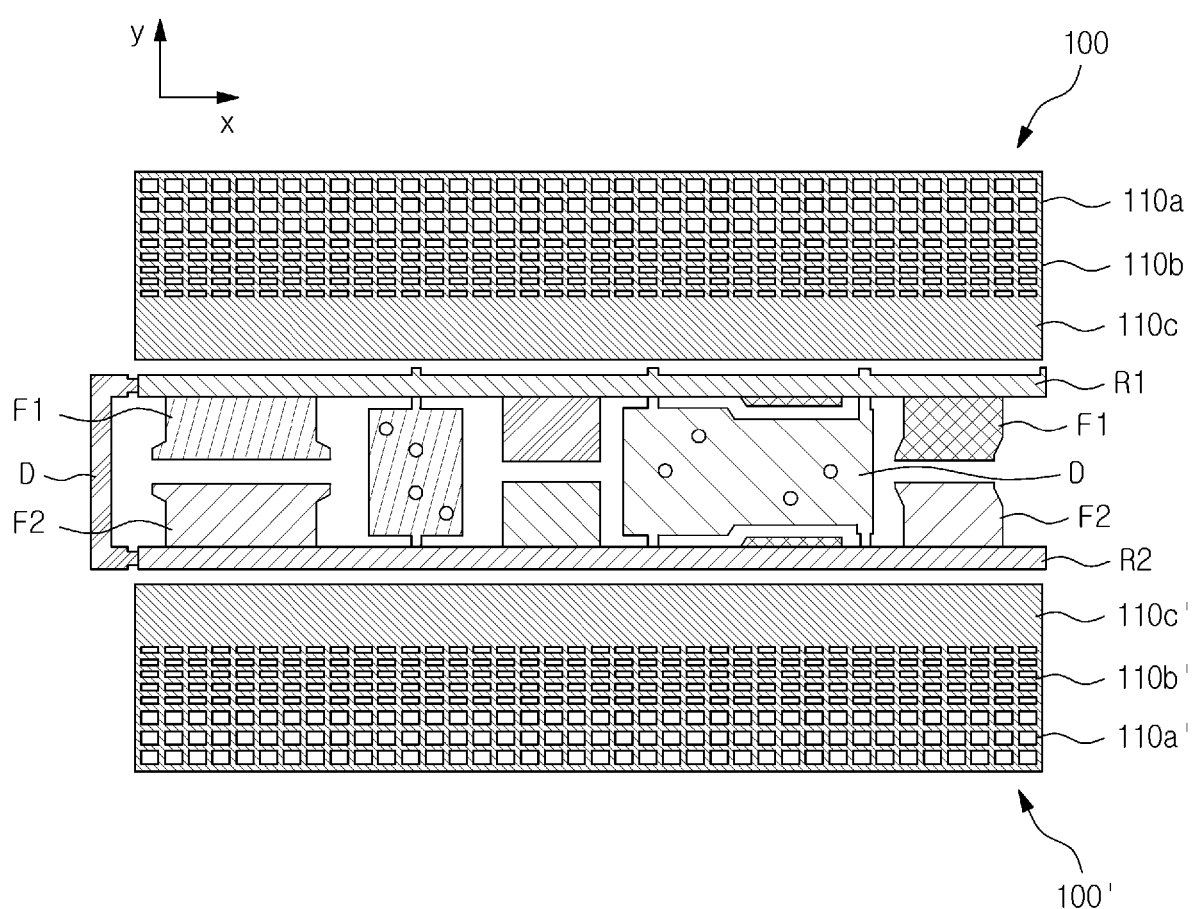
FIG. 5 depicts an example of the ground layer and the printed circuit board.
Figure 6:
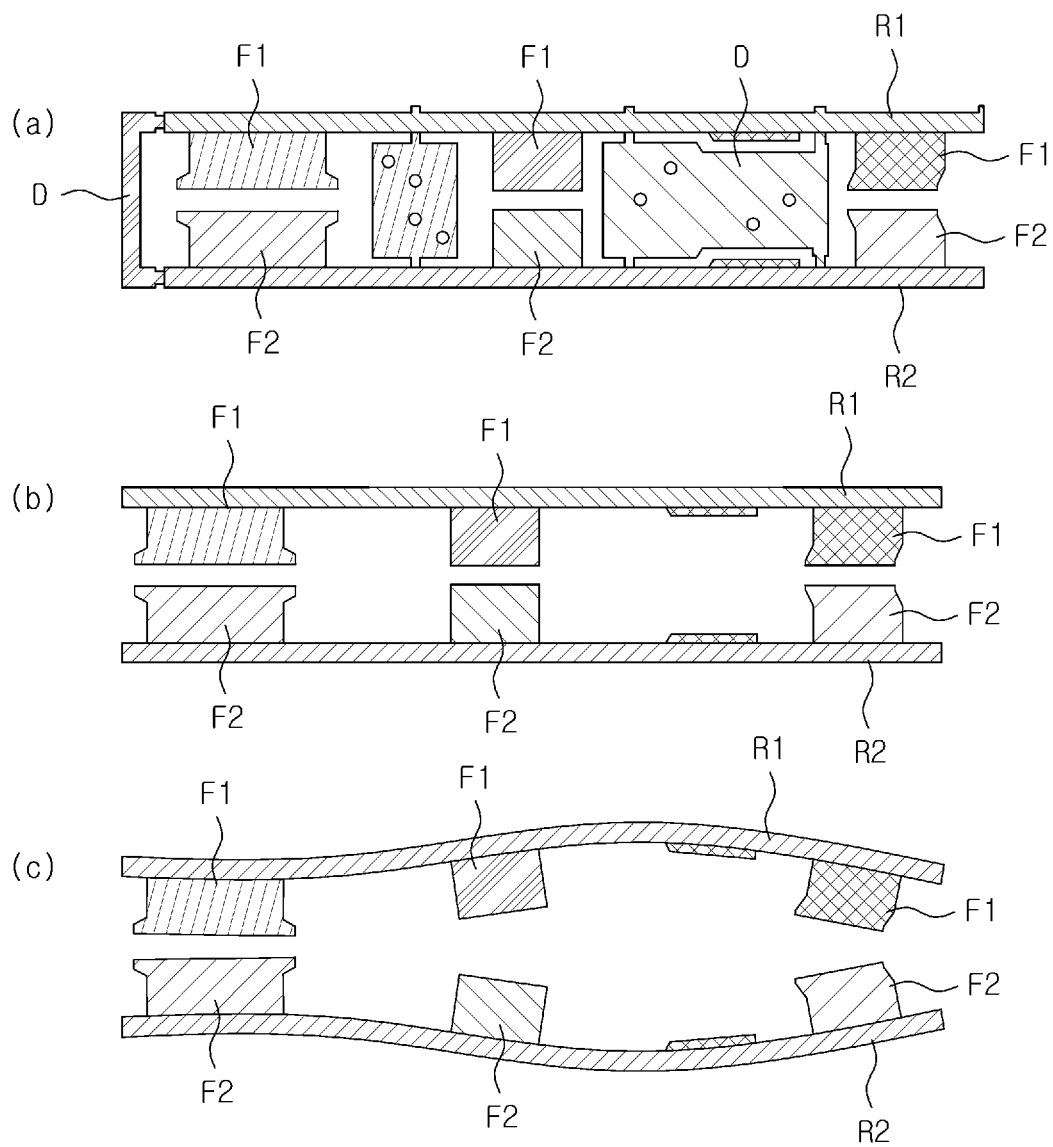
FIG. 6, (a) to (c), depicts an example of warpage of the printed circuit board.

The remaining description of the ground layer 100 may be the same as what is described above, for example FIG. 5 depicts an example of the ground layer and the printed circuit board consistent with the present disclosure, and FIG. 6 depicts an example of warpage of the printed circuit board.

The printed circuit board consistent with an example of the present disclosure includes: first rigid portion R1 and second rigid portion R2 separated from each other in one direction and arranged in parallel with each other; first flexible portion F1 coupled to the first rigid portion R1 so as to be interposed between the first rigid portion R1 and the second rigid portion R2; and second flexible portion F2 coupled to the second rigid portion R2 so as to be interposed between the first rigid portion R1 and the second rigid portion R2. The one direction may be the y-axis direction in FIG. 5.

The first rigid portion R1 and the second rigid portion R2 are each a portion that includes an insulating layer made of a rigid material and has little flexibility, and the first flexible portion F1 and the second flexible portion F2 are each a portion that includes an insulating layer made of a flexible material and has flexibility greater than the rigid portion.

The first rigid portion R1 and the second rigid portion R2 may be symmetrical with each other. The first flexible portion F1 and the second flexible portion F2 may be symmetrical with each other.

The length of the first rigid portion R1 in one direction is less than the length of the first flexible portion F1 in the one direction. Moreover, the length of the first rigid portion R1 in the one direction is less than the length in another, perpendicular direction (e.g., in the x-axis direction).

Moreover, the length of the second rigid portion R2 in the one direction is less than the length of the second flexible portion F2 in the one direction. Moreover, the length of the second rigid portion R2 in the one direction is less than the length in another, perpendicular direction (i.e., in the x-axis direction).

In such a case, in the first rigid portion R1 and the second rigid portion R2, warpage in the y-axis direction may need to be controlled.

The first flexible portion F1 and the second flexible portion F2 may be each configured in plurality. As shown in FIG. 5, for the single first rigid portion R1 extending in the x-axis direction, a plurality of first flexible portions F1 are each arranged in the y-axis direction, and the plurality of the first flexible portions F1 are aligned with one another in the x-axis direction.

Moreover, for the single second rigid portion R2 extending in the x-axis direction, a plurality of second flexible portions F2 are each arranged in the y-axis direction, and the plurality of the second flexible portions F2 are aligned with one another in the x-axis direction.

The first rigid portion R1 may include first ground layer 100 including metals 110*a*, 110*b*, 110*c*, and the first ground layer 100 may be divided into a plurality of sections that are arranged in parallel in the one direction, and the areas of two adjacent sections of the plurality of sections of the first ground layer 100 may be different from each other. The areas of the metals 110*a*, 110*b*, 110*c* of the first ground layer 100 may be increased from one section on one side of the ground layer to another section on the opposite side of the ground layer. The areas of the metals 110*a*, 110*b*, 110*c* of the first ground layer 100 may be determined based on the areas of the corresponding circuits of the circuit layer 200. The metals 110*a*, 110*b*, 110*c* of the first ground layer 100 may be configured with a plurality of linear structures. In the case where the metals 110*a*, 110*b*, 110*c* of the first ground layer 100 are configured with the plurality of linear structures, the areas of the metals 110*a*, 110*b*, 110*c* of the first ground layer 100 may be adjusted based on the gaps between the plurality of linear structures. The areas of the metals 110*a*, 110*b*, 110*c* may be adjusted with the size and number of openings that expose the insulating layer.

The remaining description of the ground layer may be applied to the first ground layer.

The second rigid portion R2 may include second ground layer 100' including metals 110*a*', 110*b*', 110*c*', and the metals 110*a*, 110*b*, 110*c* of the first ground layer 100 and the metals 110*a*', 110*b*', 110*c*' of the second ground layer 100' may be symmetrical with each other (i.e., symmetrical about the x-axis) in terms of the area.

Specifically, as the first ground layer 100 is divided into a plurality of sections (referred to as first sections, hereinafter), the second ground layer 100' is also divided into a plurality of sections (referred to as second sections, hereinafter). The areas of the metals 110*a*, 110*b*, 110*c* for each of the plurality of first sections are symmetrically substantially the same (i.e., symmetrical about the x-axis) with the area of the metals 110*a*', 110*b*', 110*c*' for each of the plurality of second sections.

For example, as illustrated in FIG. 5, while the area of each of the metals 110*a*, 110*b*, 110*c* of the first ground layer 100 decreases in the +y direction, the area of each of the metals 110*a*', 110*b*', 110*c*' of the second ground layer 100' decreases in the −y direction. Moreover, in the first ground layer 100 and the second ground layer 100', the areas of the metal thereof are symmetrical with each other about the x-axis.

The first rigid portion R1 and the second rigid portion R2 may be physically connected with each other by a dummy portion D. The dummy portion D may be configured in plurality. The dummy portion D may connect an end portion in the x-direction of the first rigid portion R1 with an end portion in the x-direction of the second rigid portion R2 and may connect an end portion in the y-direction of the first rigid portion R1 with an end portion in the y-direction of the second rigid portion R2.

The dummy portion D may be formed to avoid or separate the first flexible portion F1 from the second flexible portion F2. In other words, the dummy portion D and the first flexible portion F1 (the second flexible portion F2 as well) do not overlap with each other. Moreover, the dummy portion D includes a bridge, which is formed with a narrow width at a portion adjacent to the first rigid portion R1 (or the second rigid portion R2).

As shown in (a) of FIG. 6, the printed circuit board may be processed for reflow, with the dummy portion D included therein. In the reflow process, as well as in the process of cooling the printed circuit board to room temperature, uneven stress may be effected in the printed circuit board. That is, due to the difference in physical properties (e.g., CTE, melting point, modulus, etc.) between the materials in the printed circuit board, stress may be differently effected at different portions of the printed circuit board. Nevertheless, before the dummy portion D is removed, warpage is mitigated in the printed circuit board, owing to the bearing power or sturdiness of the dummy portion D. Accordingly, the warpage is inhibited by force, and residual stress stays included in the printed circuit board. However, once the dummy portion D is removed by eliminating the bridge through a routing process as shown in (b) of FIG. 6, the printed circuit board may become warped due to residual stress, and particularly, the first rigid portion R1 and the second rigid portion R2, which are short in the y-direction, may become warped in the y-direction, as shown in (c) of FIG. 6.

That is, as long as the area of the metal (i.e., copper) is not different from one section to another section in the first ground layer 100 and the second ground layer 100', the first rigid portion R1 may be warped to bulge up (hence, "concave") in the +y direction, and the second rigid portion R2 may be warped to bulge down (hence, convex) in the y-direction.

Referring to the following equations, there are a couple of ways for inhibiting the deformation (i.e., curvature (φ)); (1) minimizing the moment M occurred by the uneven CTE between the materials; and (2) increasing the bending rigidity (i.e., coefficient of elasticity (E) and moment of inertia (I)). In the case where the rigid portions R1, R2 are thin in the y-axis direction and long in the x-axis direction, controlling the unevenness of CTE may be more preferable.

$$\phi = \frac{M}{EI} \quad \text{Equation 1}$$

$$I = \frac{bh^3}{12} \quad \text{Equation 2}$$

φ curvature (deformation)
M: moment occurred by uneven CTE
E: coefficient of elasticity
I: moment of inertia
b: thickness (length of rigid portion R in y-axis)
h: length (length of rigid portion R in x-axis)

Assuming that the CTE of the insulating material of the insulating layer is 20 ppm/° C., and the CTE of copper (Cu) is 16.4 ppm/° C., the average CTE of the insulating layer and copper (or CTE of the ground layers 100, 100') may be controlled by adjusting the area of copper in the ground layers 100, 100', and as a result, the warpage of the printed circuit board (actually, the rigid portions R1, R2) may be controlled.

Specifically, during the cooling from a high temperature to room temperature, the first rigid portion R1, which bulges up (i.e., "concave"), needs to be given more bulging-down (i.e., "convex") stress. For this, the areas of metal in the first ground layer may decrease in the +y direction (see reference numeral 100 in FIG. 5).

The average CTE of the insulating layer and copper may be increased by decreasing the area (or portion) of copper. As the areas of the metal in the first ground layer decrease in the +y direction, the average CTE of the insulating layer and copper included in the first ground layer increases in the +y direction. Accordingly, during the change from a high temperature to room temperature, the first rigid portion R1 may be given more bulging-down (i.e., convex) stress.

Moreover, during the cooling from a high temperature to room temperature, the second rigid portion R2, which bulges down (i.e., convex), needs to be given more bulging-up (i.e., concave) stress. For this, the areas of metal in the second ground layer may decrease in the y-direction (see reference numeral 100' in FIG. 5).

As the areas of the metals in the second ground layer decrease in the y-direction, the average CTE of the insulating layer and copper included in the second ground layer increases in the y-direction. Accordingly, during the change from a high temperature to room temperature, the second rigid portion R2 may be given a more bulging-up (i.e., concave) stress.

Therefore, the stress is adjusted based on the area of copper in the ground layer, and the warpage of the printed circuit board in the y-axis direction is controlled, and as a result, the printed circuit board (actually, the rigid portion) become flat in the x-axis direction.

The printed circuit board described above may be utilized for a substrate for signal transfer of the main board and the display installed in a tablet PC, a notebook computer or a smartphone. Particularly, as the flexible portion F may be highly flexible, the space of the printed circuit board may be better utilized when the printed circuit board includes the flexible portion F.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board, comprising:
   a circuit layer; and
   a ground layer disposed above the circuit layer, the ground layer comprising ground layer sections each comprising metal members, the ground layer sections arranged in parallel in one direction on a plane,
   wherein areas of the metal members of adjacent ground layer sections are different from each other, and wherein the areas of the metal members are determined based on respective areas of circuits of the circuit layer corresponding to respective ground layer sections, each of the areas of the metal members of the ground layer sections in a first direction is in a compensative relationship with the respective area of circuits of the circuit layer in the first direction, and the printed circuit board has a shorter length in the first direction than a second direction.

2. The printed circuit board of claim 1, wherein the areas of the metal members increase from one ground layer section of the ground layer sections to an opposite ground layer section of the ground layer sections.

3. The printed circuit board of claim 2, wherein when the areas of the metal members increase from one ground layer section of the ground layer sections to an opposite ground layer section of the ground layer sections, the areas of the metal members of circuits of the circuit layer corresponding to respective ground layer sections decrease.

4. The printed circuit board of claim 1, wherein a length of the printed circuit board in the one direction is less than a length of the printed circuit board in another direction perpendicular to the one direction.

5. The printed circuit board of claim 1, wherein the metal members are linear structures.

6. The printed circuit board of claim 5, wherein the areas of the metal members in each of the ground layer sections are adjusted based on gaps between the linear structures.

7. The printed circuit board of claim 5, wherein the linear structures are configured as a mesh structure.

8. The printed circuit board of claim 1, wherein a first area of the areas of metal members is greater than a second area of the areas of metal members, and the second area of the areas of metal members is greater than a third area of the areas of metal members.

9. A printed circuit board, comprising:
a rigid portion comprising a ground layer comprising ground layer sections comprising metal members, the ground layer sections arranged in parallel in one direction; and
a flexible portion extending from the rigid portion in the one direction of the ground layer sections,
wherein, in a first direction, adjacent ground layer sections have respective areas of metal members that are different from each other,
a first area of the areas of metal members is greater than a second area of the area of metal members, and the second area of the area of metal members is greater than a third area of the areas of metal members, and
the printed circuit board has a shorter length in the first direction than a second direction.

10. The printed circuit board of claim 9, wherein the areas of the metal members increase from one ground layer section of the ground layer sections to an opposite ground layer section of the ground layer sections.

11. The printed circuit board of claim 9, wherein the metal members are linear structures.

12. The printed circuit board of claim 11, wherein the areas of the metal members in each of the ground layer sections are adjusted based on gaps between the linear structures.

13. The printed circuit board of claim 11, wherein the linear structures are configured as a mesh structure.

14. The printed circuit board of claim 9, wherein a length of the rigid portion in the one direction is less than a length of the flexible portion in the one direction.

15. A printed circuit board, comprising:
a circuit layer; and
a ground layer disposed above the circuit layer, the ground layer comprising ground layer sections each comprising metal members, the ground layer sections arranged in parallel in one direction on a plane,
wherein areas of the metal members of adjacent ground layer sections are different from each other,
the areas of the metal members in a first direction are determined based on respective areas of circuits of the circuit layer corresponding to respective ground layer sections,
a first area of the areas of metal members is greater than a second area of the areas of metal members, and the second area of the areas of metal members is greater than a third area of the areas of metal members, and
the printed circuit board has a shorter length in the first direction than a second direction.

16. The printed circuit board of claim 15, wherein the areas of the metal members increase from one ground layer section of the ground layer sections to an opposite ground layer section of the ground layer sections.

17. The printed circuit board of claim 16, wherein when the areas of the metal members increase from one ground layer section of the ground layer sections to an opposite ground layer section of the ground layer sections, the areas of the metal members of circuits of the circuit layer corresponding to respective ground layer sections decrease.

18. The printed circuit board of claim 15, wherein a length of the printed circuit board in the one direction is less than a length of the printed circuit board in another direction perpendicular to the one direction.

19. The printed circuit board of claim 15, wherein the metal members are linear structures.

20. The printed circuit board of claim 19, wherein the areas of the metal members in each of the ground layer sections are adjusted based on gaps between the linear structures.

* * * * *